(12) United States Patent
Woodward, Jr. et al.

(10) Patent No.: US 12,094,651 B2
(45) Date of Patent: Sep. 17, 2024

(54) OPTIMIZING TRANSFORMER EXCITING CURRENT AND LOSS TEST RESULTS BY DYNAMICALLY MANAGING CORE MAGNETIC STATE

(71) Applicant: Doble Engineering Company, Marlborough, MA (US)

(72) Inventors: Robert C. Woodward, Jr., Marlborough, MA (US); Roberto C. Borges, Marlborough, MA (US)

(73) Assignee: Doble Engineering Company, Marlborough, MA (US)

( * ) Notice: Subject to any disclaimer, the term of this patent is extended or adjusted under 35 U.S.C. 154(b) by 399 days.

(21) Appl. No.: 17/721,101

(22) Filed: Apr. 14, 2022

(65) Prior Publication Data
US 2023/0223177 A1    Jul. 13, 2023

Related U.S. Application Data

(60) Provisional application No. 63/298,122, filed on Jan. 10, 2022.

(51) Int. Cl.
*H01H 47/00* (2006.01)
*H01F 7/06* (2006.01)
*H02M 3/04* (2006.01)

(52) U.S. Cl.
CPC .............. *H01F 7/064* (2013.01); *H02M 3/04* (2013.01)

(58) Field of Classification Search
None
See application file for complete search history.

(56) References Cited

U.S. PATENT DOCUMENTS

| | | | |
|---|---|---|---|
| 2002/0070724 A1* | 6/2002 | Edel | H01F 27/427 324/117 R |
| 2018/0238953 A1 | 8/2018 | Lachman | |
| 2021/0075314 A1* | 3/2021 | Dent | H01F 27/42 |

FOREIGN PATENT DOCUMENTS

CN    110828101 A    2/2020

OTHER PUBLICATIONS

Lachman et al., Single-Phase Exciting Current and Loss Measurement: Visualizing Physics Behind Data; 2015; 26 pages.
Lachmen et al.;, Extracing $I_R$, $I_L$ and $I_{Cmeas}$ Components from Single-Phase Exciting Current and Loss Measurement; 2017, 12 pages.
Duplessis, A Further Study of Exciting Current Patterns; 2002, 56 pages.

(Continued)

*Primary Examiner* — Stephen W Jackson
(74) *Attorney, Agent, or Firm* — Harness, Dickey & Pierce, P.L.C.; Anthony G. Fussner

(57) ABSTRACT

Disclosed herein are systems and methods for optimizing transformer exciting current and loss test results by dynamically managing core magnetic state. In an exemplary embodiment, a method includes injecting a direct current (DC) offset voltage; adjusting at least one of a polarity and a magnitude of the DC offset voltage while monitoring a test current for one or more criteria; and bypassing a source of the DC offset voltage when the test current has satisfied the one or more criteria, whereby residual magnetism, if any, of a core of the transformer is minimized.

20 Claims, 17 Drawing Sheets

(56) References Cited

OTHER PUBLICATIONS

Proffitt; Glaring Example of the Effects of Residual Magnetism on Large Single-Phase Transformers as Determined by Routine Excitation Current Tests; Proceedings of the Sixty-Fourth Annual International Conference of Doble Clients, Sec 8-11, 1997, 3 pages.
European Search Report for EP22172536 that claims priority to the same parent application as the instant application; dated Oct. 24, 2022; 9 pages.
De Leon Francisco et al: "Elimination of Residual Flux in Transformers by the Application of an Alternating Polaity DC Voltage Source", IEEE Transactions on Power Delivery, IEEE Service Center, New York, NY, vol. 30, No. 4, Aug. 1, 2015 (2015-0-01) pp. 1727-1734.
Robalino Diego M: "Power Transformer Demagnetization", 2016 IEEE 36th Central American and Panama Convention (CONCAPAN XXXVI), IEEE, Nov. 9, 2016, pp. 1-5.
Zhang Shuo et al: "Improved Flux-Controlled VGCV Strategy for Eliminating and Measuring the Residual Flux of THree-Phase Transformers", IEEE Transactions on Power Delivery, IEEE Service Center, New York, NY, US, vol. 35, No. 3, Aug. 27, 2019, pp. 1237-1248.

\* cited by examiner

FIG. 1

| OLTC | Test kV | H3 - H1 | | | H1 - H2 | | | H2 - H3 | | | FRANK™ | Manual |
|---|---|---|---|---|---|---|---|---|---|---|---|---|
| | | mA | Watts | X | mA | Watts | X | mA | Watts | X | | |
| 16L | 10 | 8.112 | 60.988 | L | 2.919 | 25.639 | L | 8.343 | 61.539 | L | Good | |
| 16L | 10 | 9.519 | 66.990 | L | 3.104 | 27.036 | L | 8.559 | 62.184 | L | Investigate | |
| 16L | 10 | 7.311 | 56.498 | L | 3.098 | 26.679 | L | 7.944 | 59.908 | L | Good | |

FIG. 6

OPTIMIZING TRANSFORMER EXCITING CURRENT AND LOSS TEST RESULTS BY DYNAMICALLY MANAGING CORE MAGNETIC STATE

CROSS-REFERENCE TO RELATED APPLICATION

This application claims the benefit of and priority to U.S. Provisional Patent Application Ser. No. 63/298,122 filed Jan. 10, 2022. The entire disclosure of this provisional patent application is incorporated herein by reference.

FIELD

The present disclosure relates to systems and methods for optimizing transformer exciting current and loss test results by dynamically managing core magnetic state.

BACKGROUND

This section provides background information related to the present disclosure which is not necessarily prior art.

Historically, the measurement of exciting currents has been affected by the residual magnetic state of the transformer being tested. This becomes more pronounced on transformers where the test voltage is significantly less than the rated voltage of the transformer's high voltage windings.

Conventionally, it is common to run a procedure to demagnetize the transformer and then re-run the exciting current and loss test. The process of demagnetizing the transformer, however, requires a different set of equipment, which is not always available. And even if the different set of equipment is available, a different test configuration is required with different leads brought up to the top of the transformer. If the determination that the results were affected by a magnetized core was made during a review after the testing was complete and the transformer returned to service, the opportunity to demagnetize the core can easily be lost.

DRAWINGS

The drawings described herein are for illustrative purposes only of selected embodiments and not all possible implementations and are not intended to limit the scope of the present disclosure.

FIG. 1 is a matrix of currents showing different combinations of tap changers positions.

Figure 4:
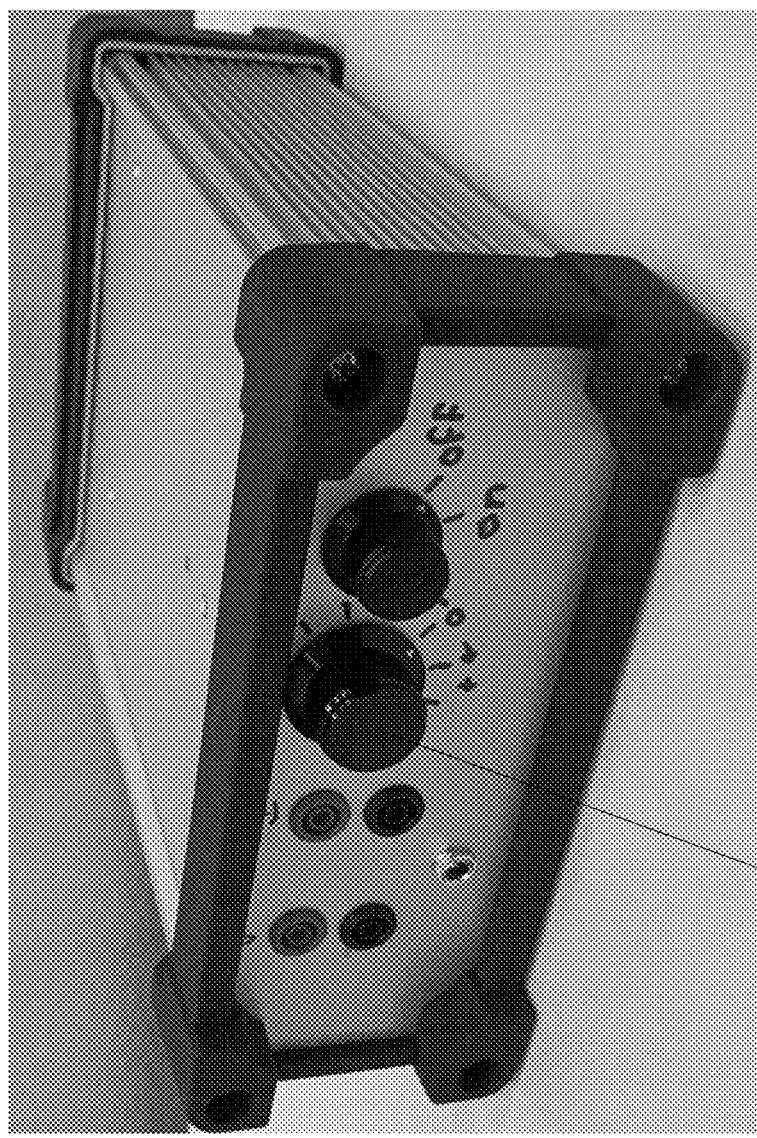
FIG. 4 shows a prototype of an external module (isolated DC voltage source) connectable in series with a test circuit employed to measure exciting current and losses according to exemplary embodiments of the present disclosure.

FIG. 6 includes example test results obtained by using the prototype module shown in FIG. 4 while performing an exciting current and loss test on a 110 kilovolt (kV) to 22.9 kV and 2.5 megavolt-ampere (MVA) transformer.

Figure 7:
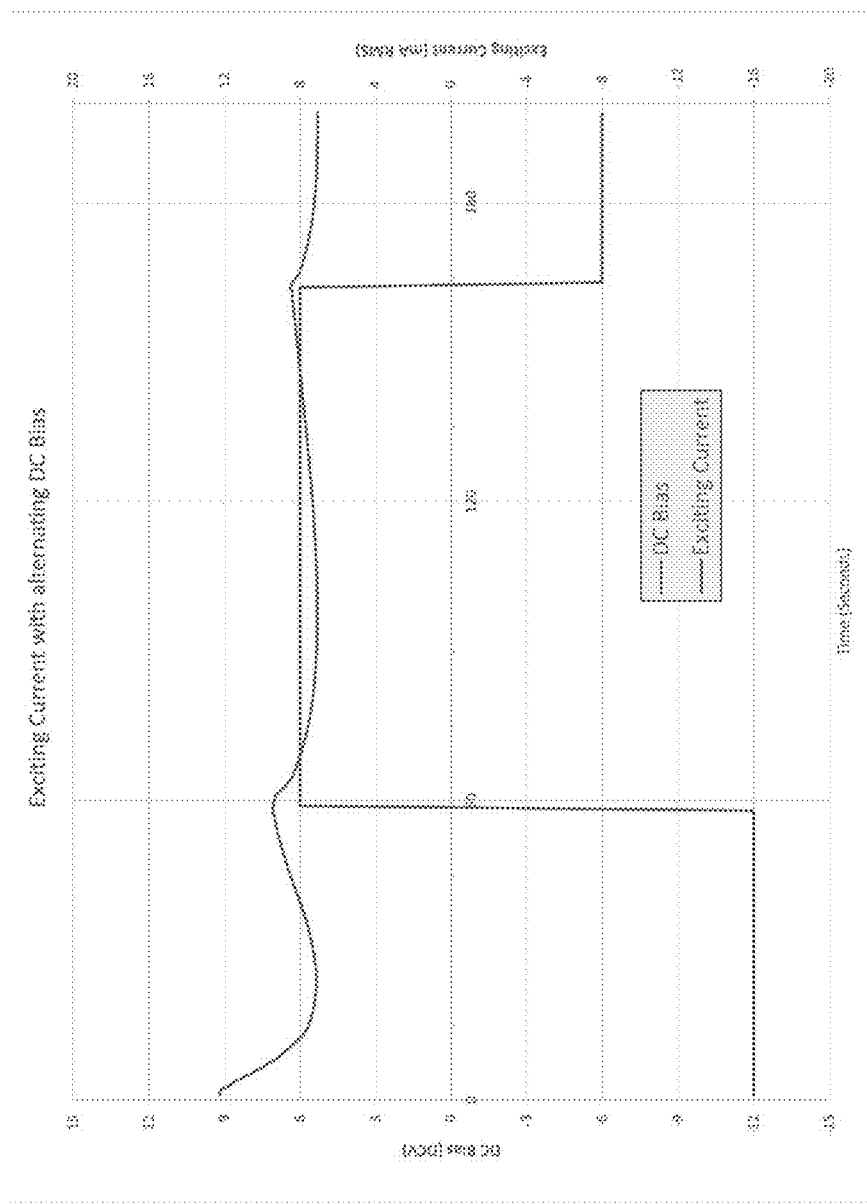

FIG. 7 is a line graph of measured exciting current in milliamps (mA RMS) and DC voltage in volts (V) versus Time.

Figure 8:
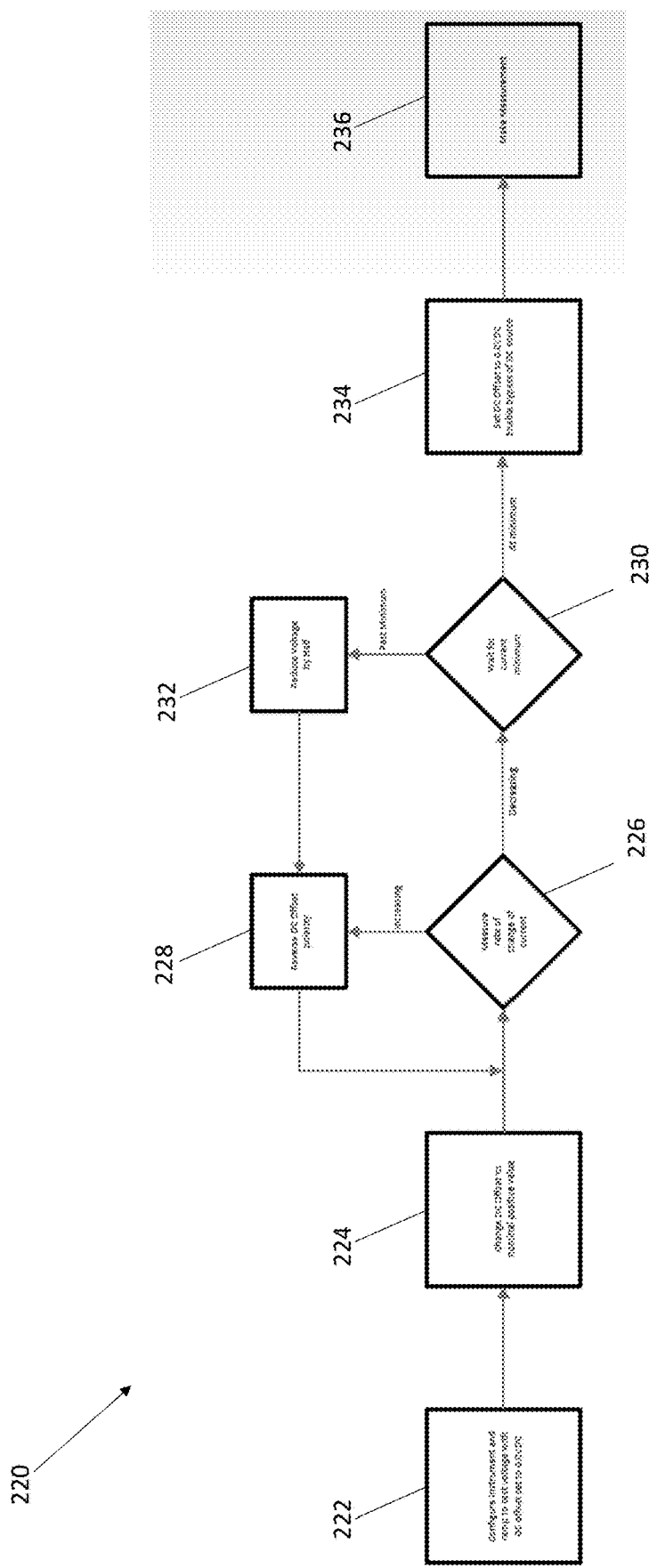

FIG. 8 is a process flow chart of an exemplary demagnetization method for optimizing transformer exciting current and loss test results by dynamically managing core magnetic state according to exemplary embodiments of the present disclosure.

Figure 9:
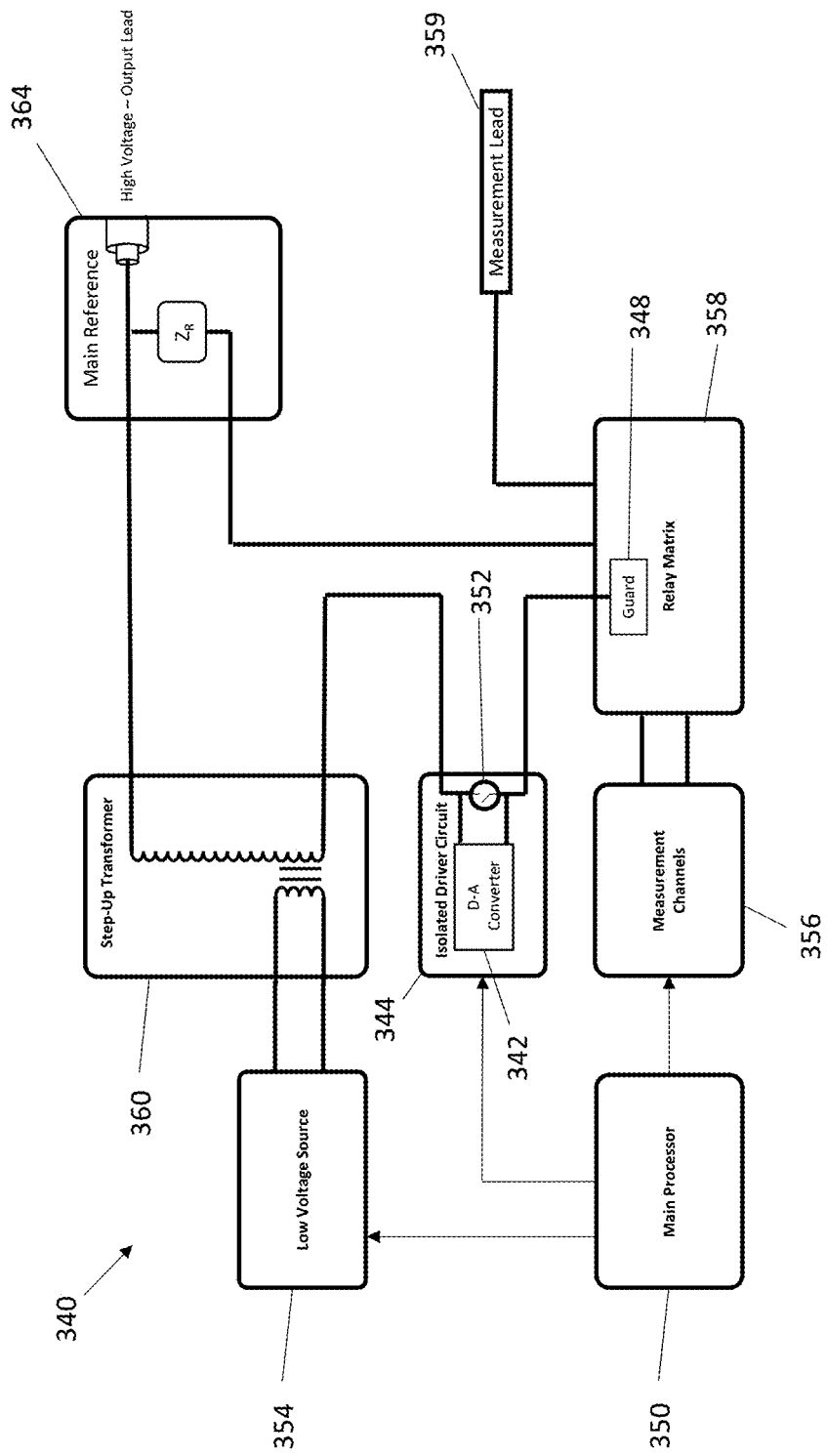

FIG. 9 illustrates a system for optimizing transformer exciting current and loss test results by dynamically managing core magnetic state according to an exemplary embodiment of the present disclosure.

Figure 10:
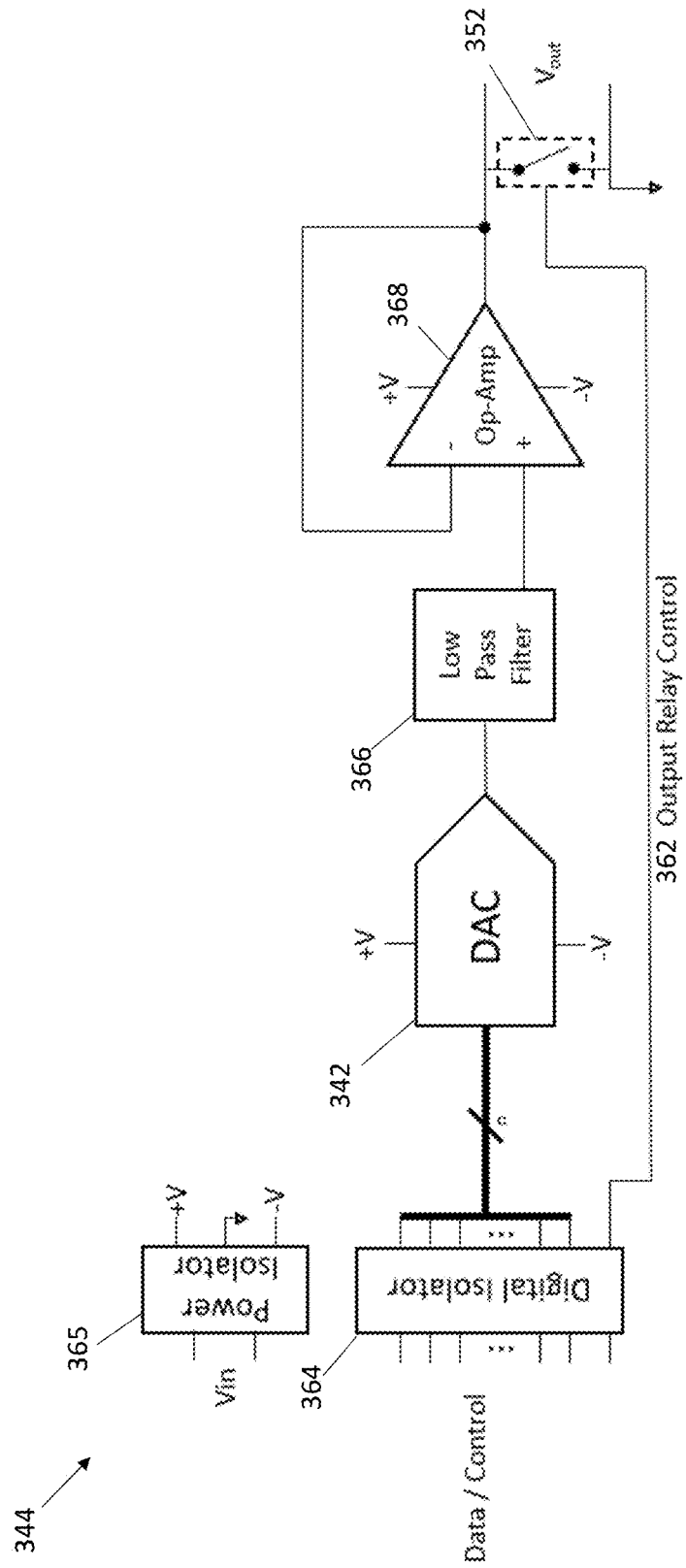

FIG. 10 illustrates details of the driver circuit shown in FIG. 9 according to an exemplary embodiment of the present disclosure.

Figure 11:
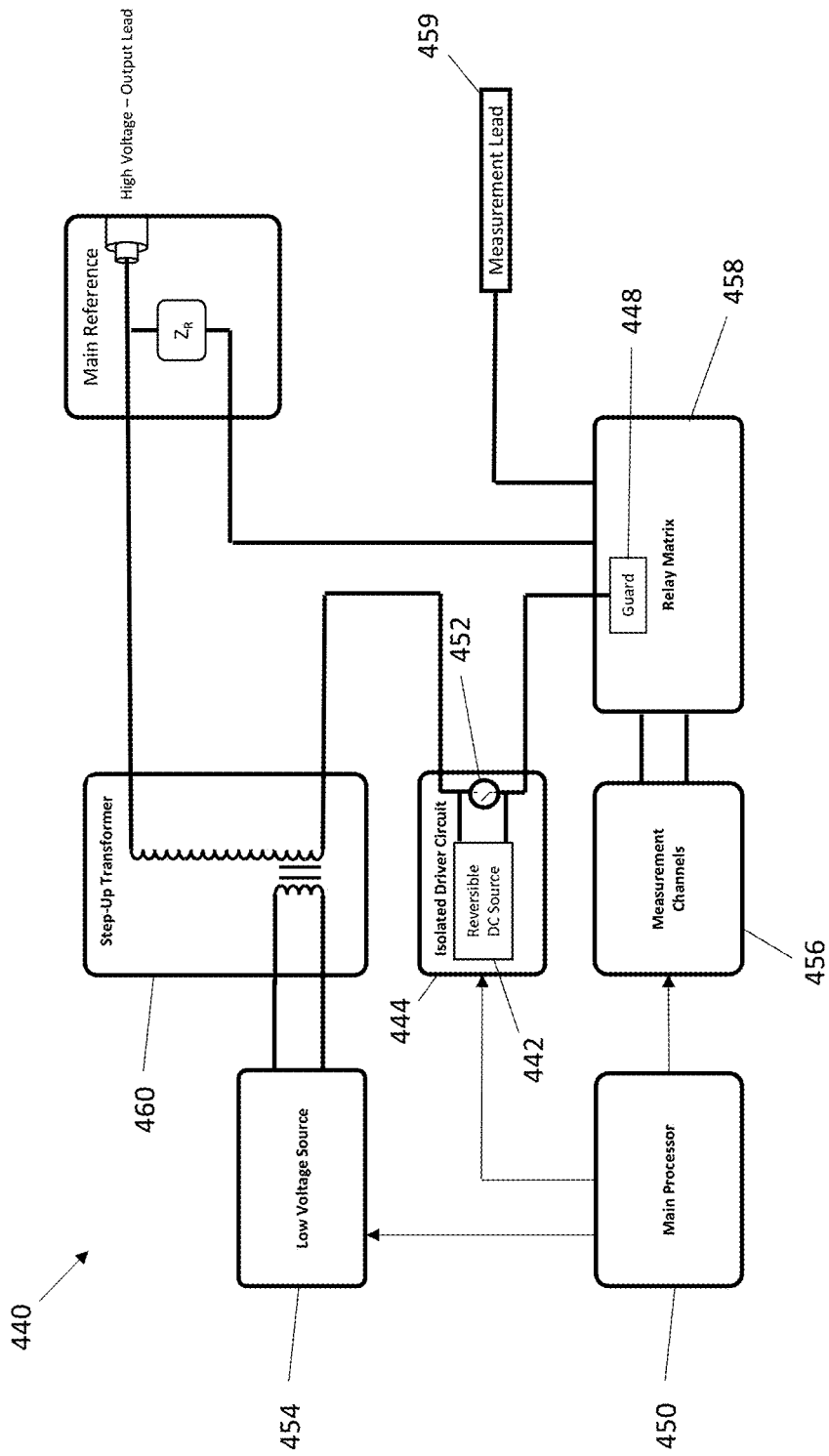

FIG. 11 illustrates a system for optimizing transformer exciting current and loss test results by dynamically managing core magnetic state according to another exemplary embodiment of the present disclosure.

Figure 12:
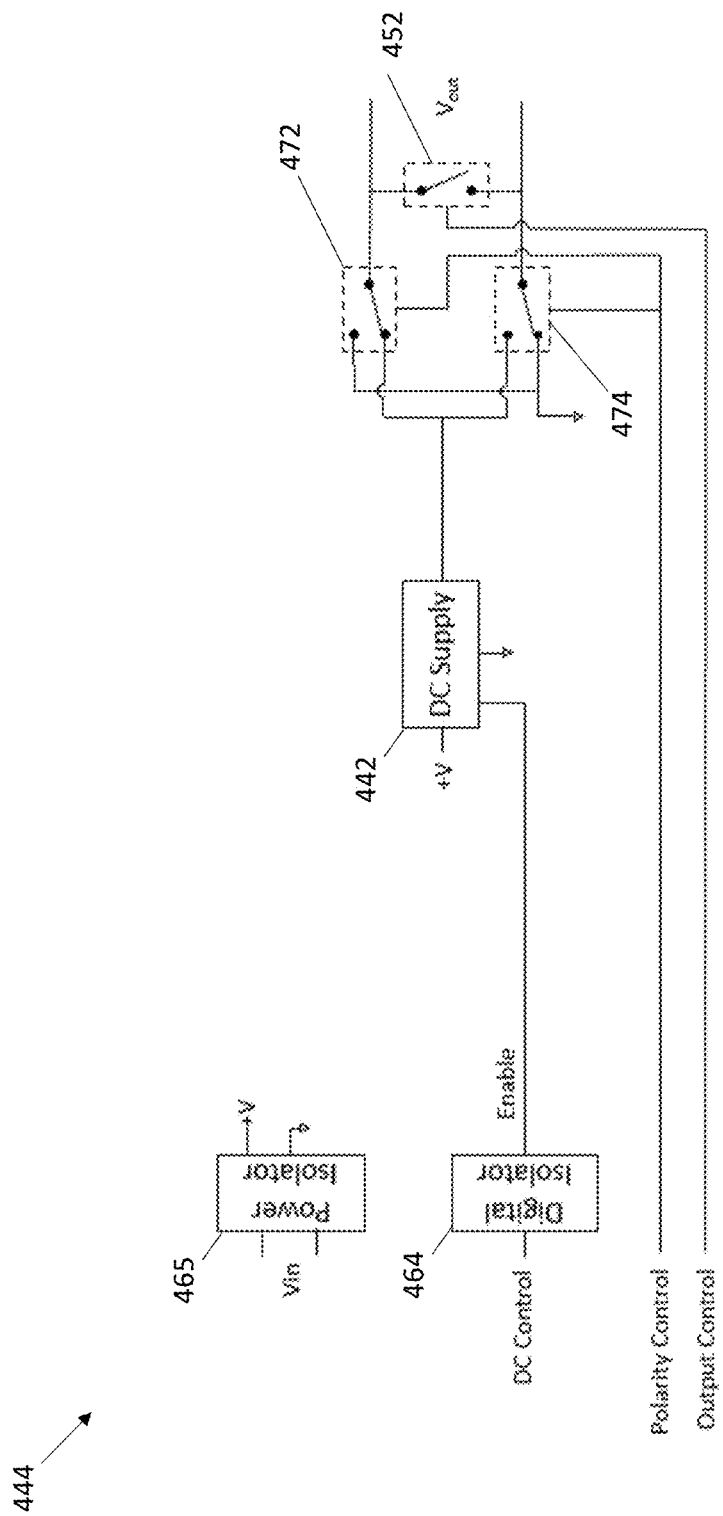

FIG. 12 illustrates details of the driver circuit shown in FIG. 11 according to an exemplary embodiment of the present disclosure.

Figure 13:
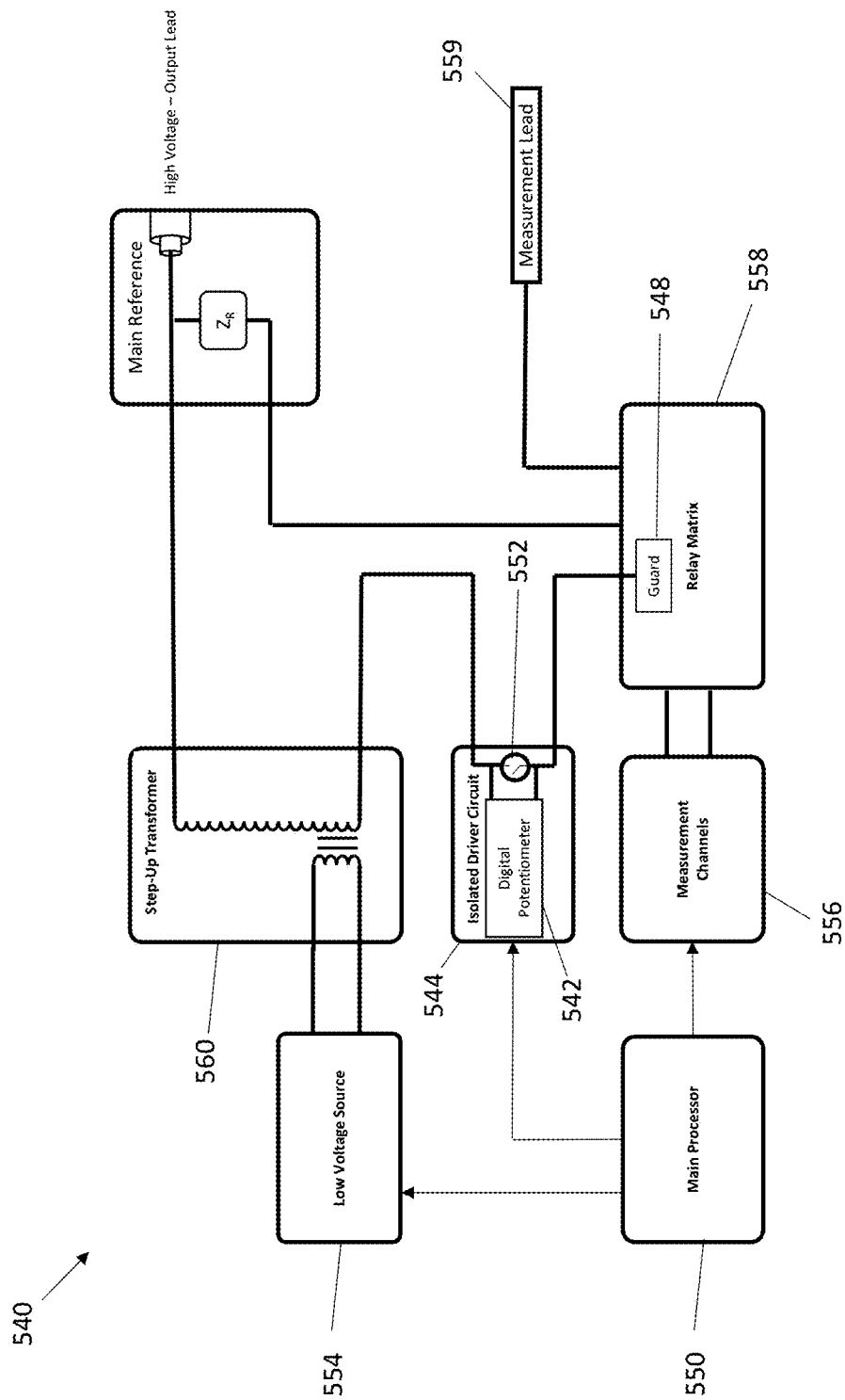

FIG. 13 illustrates a system for optimizing transformer exciting current and loss test results by dynamically managing core magnetic state according to another exemplary embodiment of the present disclosure.

Figure 14:
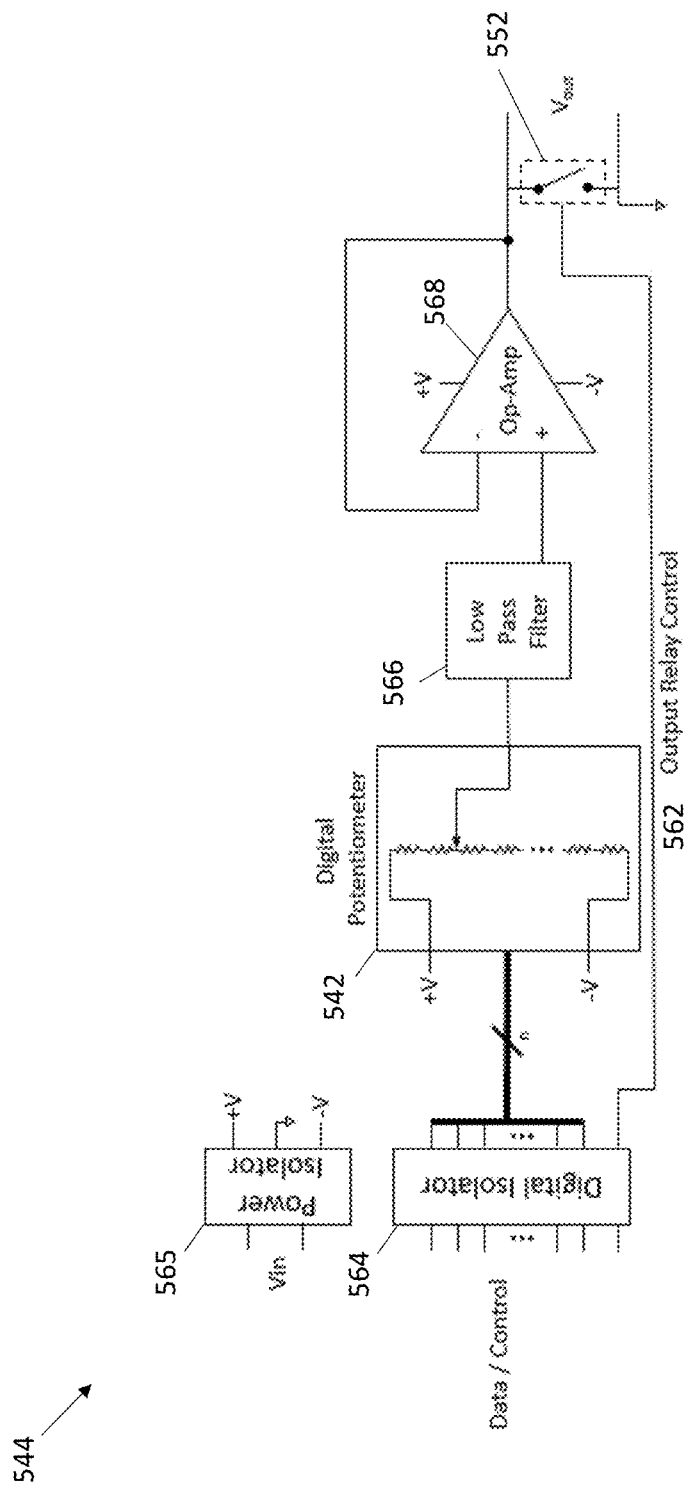

FIG. 14 illustrates details of the driver circuit shown in FIG. 13 according to an exemplary embodiment of the present disclosure.

Figure 15:
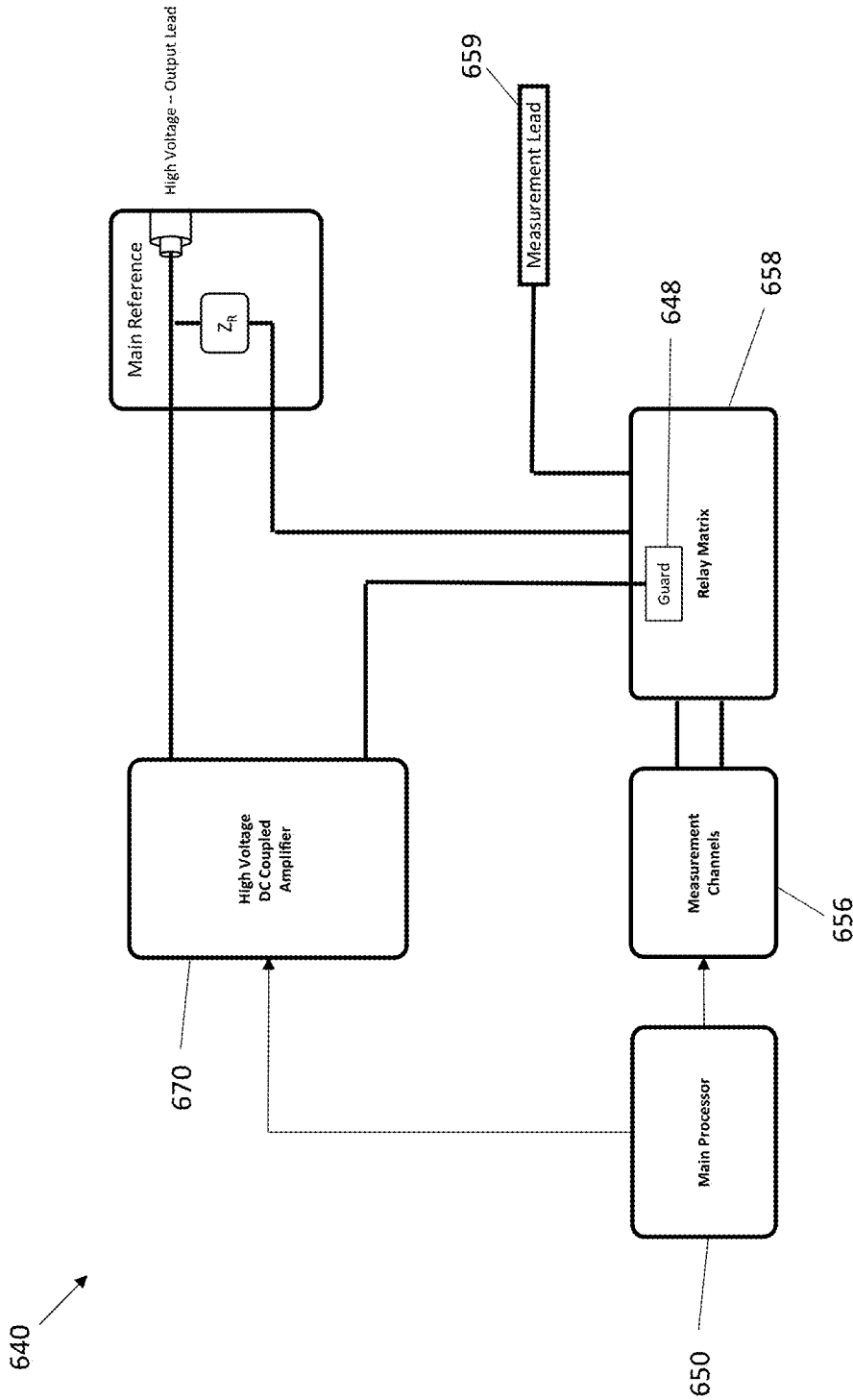

FIG. 15 illustrates a system for optimizing transformer exciting current and loss test results by dynamically managing core magnetic state according to another exemplary embodiment of the present disclosure.

Figure 16:
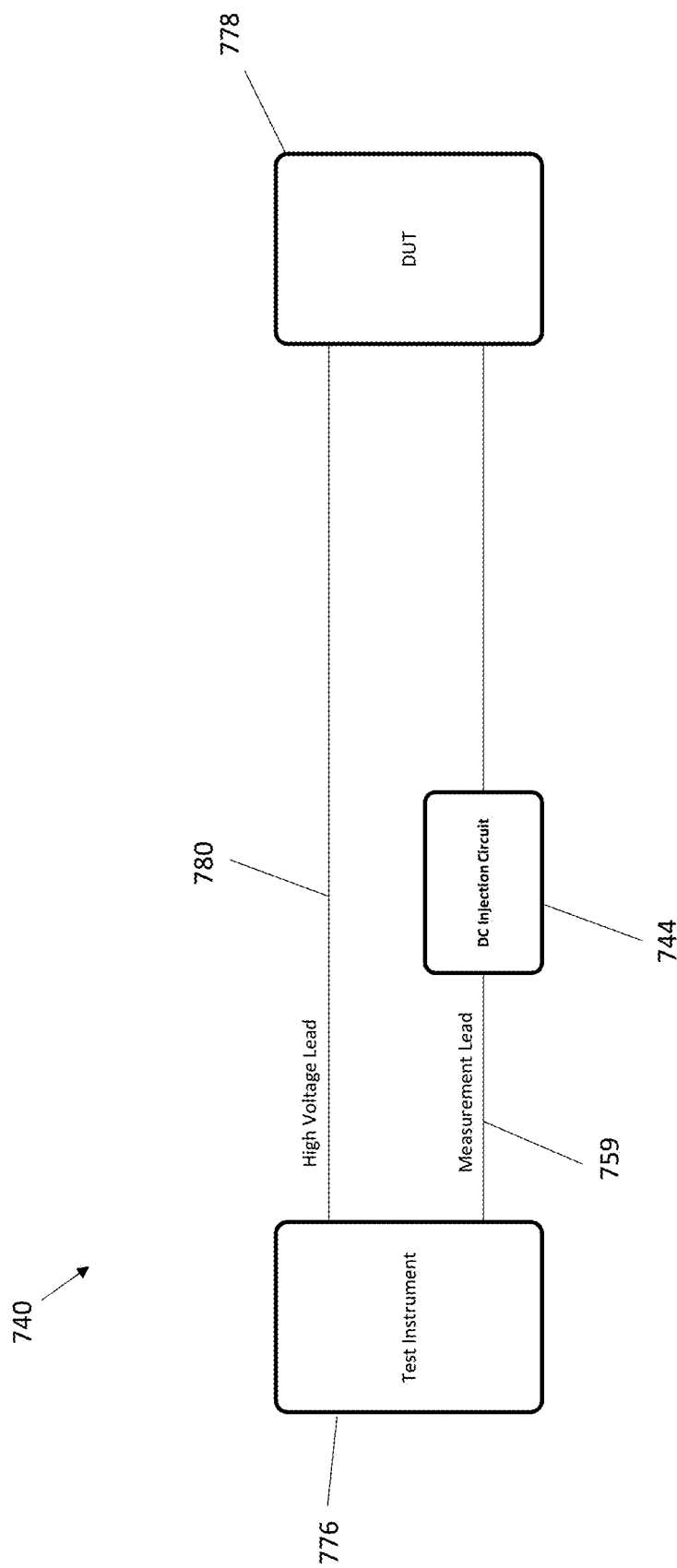

FIG. 16 illustrates a system for optimizing transformer exciting current and loss test results by dynamically managing core magnetic state according to another exemplary embodiment of the present disclosure.

Figure 17:
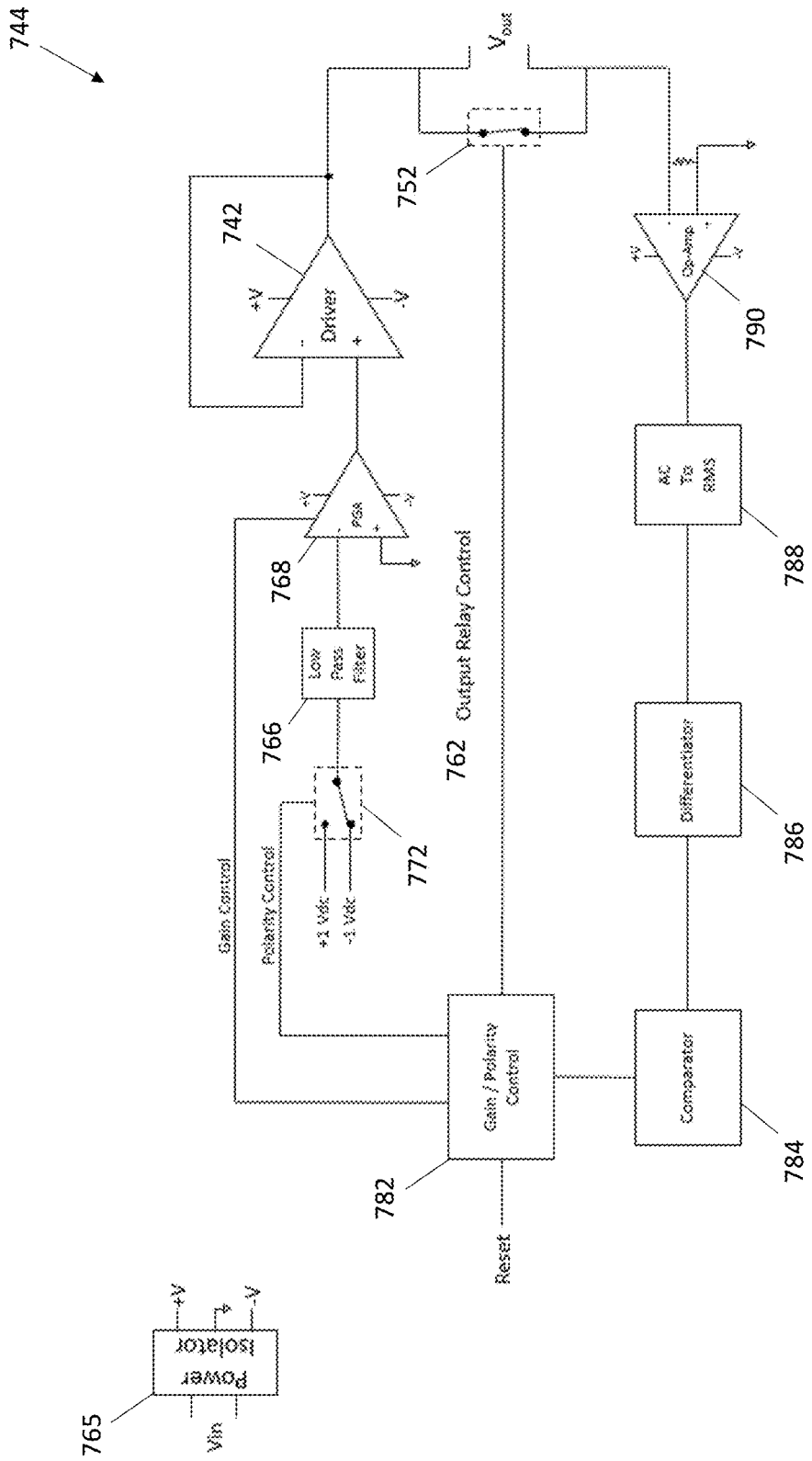

FIG. 17 illustrates details of the driver circuit shown in FIG. 16 according to an exemplary embodiment of the present disclosure.

Corresponding reference numerals may indicate corresponding (but not necessarily identical) parts throughout the several views of the drawings.

DETAILED DESCRIPTION

Example embodiments will now be described more fully with reference to the accompanying drawings.

As explained above, the measurement of exciting currents has historically been affected by the residual magnetic state of the transformer being tested. This becomes more pronounced on transformers where the test voltage is significantly less than the rated voltage of the transformer's high voltage windings.

Conventionally, it is common to run a procedure to demagnetize the transformer and then re-run the exciting current and loss test. The process of demagnetizing the transformer, however, requires a different set of equipment, which is not always available. And even if the different set of equipment is available, a different test configuration is required with different leads brought up to the top of the transformer. If the determination that the test results were affected by a magnetized core was made during a review after the testing was complete and after the transformer returned to service, the opportunity to demagnetize the core can easily be lost.

Exemplary embodiment systems and methods have been developed and/or are disclosed herein for performing exciting current and loss tests to achieve optimal consistent results that are independent of the initial magnetization state of the transformer's core, e.g., the first time, every time. This greatly increases the usefulness of the test results as a diagnostic assessment of the transformer under test.

Exemplary embodiments are disclosed herein of systems and methods to optimize or improve exciting current and loss test results by dynamically managing (e.g., manually by an operator, automatically via software control, etc.) the magnetic state of the core. Advantageously, this eliminates the need to demagnetize the transformer with a different test set and/or setup.

By way of further background, exciting current and loss test is defined as an open-circuit measurement of current and loss, typically, on the high voltage (HV) side of the transformer using a low-voltage (e.g., up to 10 kilovolts (kV), etc.) single-phase power frequency (e.g., 50/60 hertz (Hz), etc.) excitation. The tests are performed on each phase and on various tap changer positions. For wye and zig-zag configurations, one phase is excited and measured with all other line bushings floating; if neutral is not accessible, two phases are excited and measured in series; for delta configuration, two phases are excited with only one measured.

Current diagnostic criteria are based on the evaluation of a two-dimensional matrix of currents and watts and the identification of DETC (de-energized tap changer), LTC (load tap changer), and phase patterns (see FIG. 1), which are defined by various phenomena, other than failure modes, influencing the data.

Figure 1:
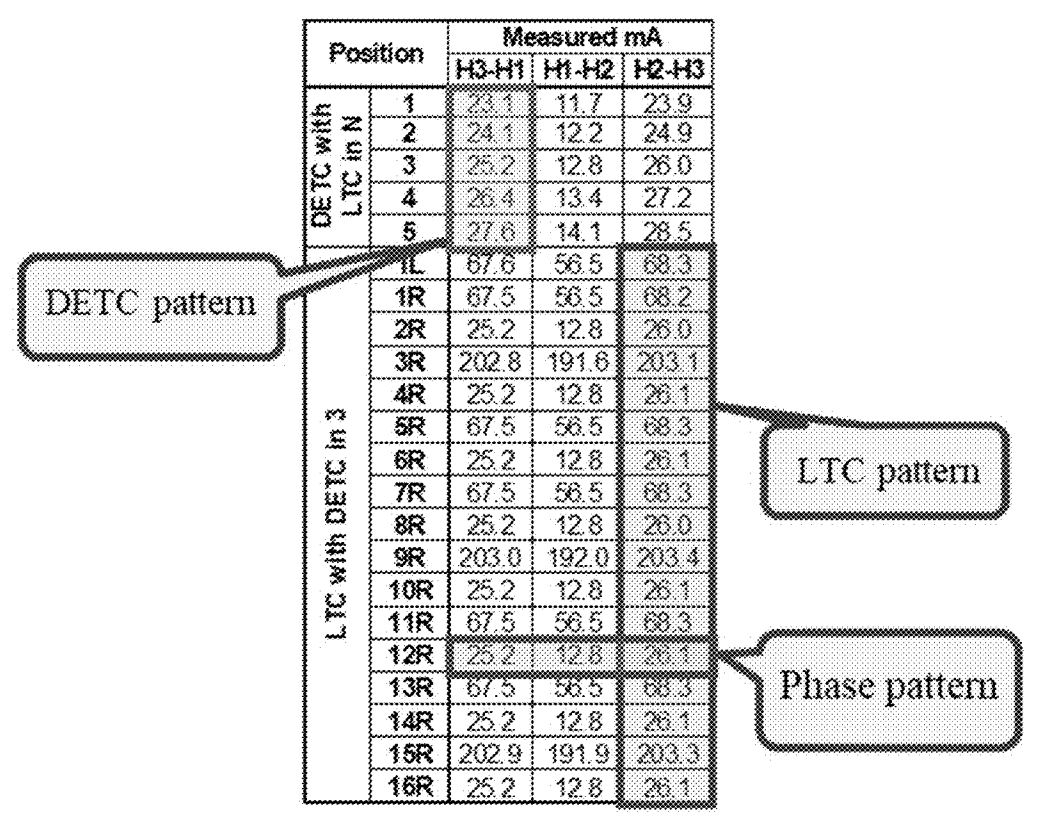

For example, FIG. 1 illustrates a matrix of currents showing different combinations of tap changers positions. The patterns can be defined as follows:
- Phase pattern—resulting from comparison of 3 phases for each combination of DETC and LTC positions
- DETC pattern—resulting from comparison of (HV side) DETC positions in each phase
- LTC pattern—resulting from comparison of LTC positions in each phase.

When assessing transformers in the field, the first step after performing the exciting current measurement on all three phases is to inspect the phase pattern. In most units with lagging $I_{meas}$ (measured currents), the patterns can be predicted by knowing the core type and examining the electrical diagram on the nameplate. For instance, the expected phase pattern on three- and five-legged core-type and shell-type units is of two high similar readings and a lower reading (2H1L), with the latter obtained on the phase located on the middle leg of the core. Other core types and winding configurations might lead to different patterns.

Experience and research on the topic have shown that the phase pattern can be affected by a couple of different factors, these include:
- Core Configuration
- Test Voltage
- Insulation Capacitance
- Residual Magnetism.

Among these factors, residual magnetism is one of the most common in the field. When phase patterns are distorted, the diagnostic criteria become less certain and could suggest a problem in the transformer where there is not. As disclosed herein, the methodology for optimizing exciting current and loss test results by dynamically managing core magnetic state enables instruments performing exciting current and loss tests to achieve optimal, consistent results, independent of the initial magnetization state of the transformer's core. This greatly increases the usefulness of the test results as a diagnostic assessment of the transformer under test.

Magnetic Core State

Figure 2:
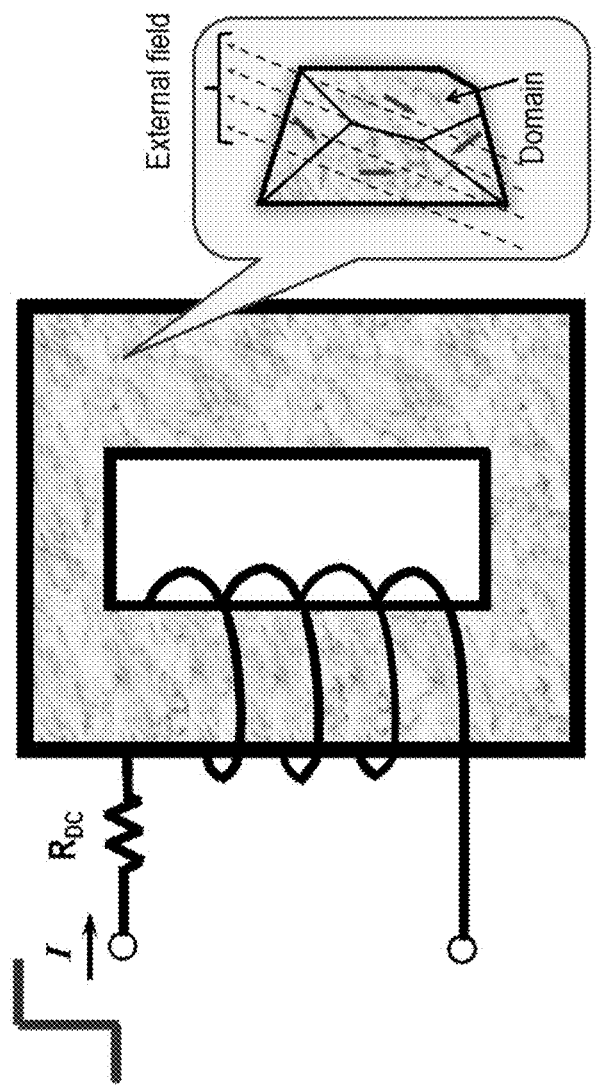
FIG. 2 illustrates magnetic domains in ferromagnetic materials.

At a molecular level, ferromagnetic materials (e.g., steel alloys for transformer's core construction) are divided in volumes, where molecular currents create an internal magnetic field. Such volumes are referred to as Magnetic Domains, and the internal magnetic field is created by a combination of the rotation of electrons in the atoms and the electron spin. See, for example, FIG. 2 showing magnetic domains as portions of the ferromagnetic material divided by solid lines (at molecular level), which may be referred to as Domain Walls. The internal magnetic field of the domains are represented by arrows in FIG. 2.

When the core is demagnetized and the transformer is de-energized, the magnetic domains arrange their internal magnetic fields to achieve a state of less energy required, and therefore, the internal magnetic fields will be randomly oriented. When the transformer is energized, the presence of current in the excited winding creates an external magnetic field as represented by dotted arrows in FIG. 2. Under these conditions, the internal magnetic fields of domains will be affected by the presence of the external magnetic field and the domains will rotate following the direction of the external magnetic field. This process is represented by the hysteresis loop shown in FIG. 3.

Figure 3:
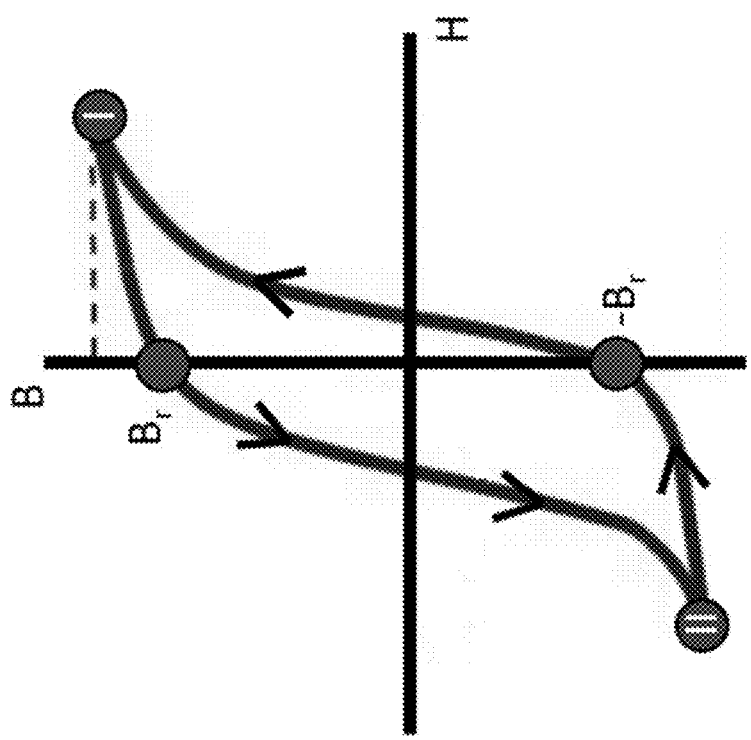
FIG. 3 is a line graph of a hysteresis loop in which H is the magnetizing force or magnetic field intensity, and B represents the flux density.

In FIG. 3, H is the magnetizing force or magnetic field intensity, and it is proportional to the current in the excited winding. B represents the flux density. Their relationship is given by the constitutive equation below.

$$B = \mu H$$

In the above equation, $\mu$ is the permeability of the ferromagnetic material. When the transformer is energized with 60 Hz AC voltage and currents, the direction of the external magnetic field changes 120 times per second, and the magnetic domains follow such rotation. In FIG. 3, the loop extremes I and II represent the state of saturation at which the internal magnetic fields of the domains are all aligned with the direction of the external magnetic field.

When the transformer is de-energized, the domain structure corresponding to the moment of interruption is formed. And there will be a group of domains that contains domains already arranged around a minimum energy level. These domains remain as they are, thus retaining magnetic memory shaped by the moment of interruption. These domains preserve an alignment creating a residual magnetic field as represented by $B_r$ in FIG. 3. This field, often referred to as residual or remnant magnetism, will manifest itself as an increase in reluctance (due to a change in permeability $\mu$) during a subsequent test, which alters the phase pattern of the exciting current and loss measurements.

As explained above, transformer cores can stay magnetized after de-energization depending on the domain structure corresponding to the moment of interruption. There are other ways for a transformer's core to become magnetized, including the DC winding resistance test. The DC winding resistance test is a common test performed in the field to assess the condition of the electrically conductive path. To measure the resistance of the winding, the transformer is energized with a DC current, which creates an external magnetic field with a fixed polarity. This causes the magnetic domains to rotate and align with such external magnetic field. As a result, the core remains magnetized after the winding resistance is measured. If an exciting current and loss test is to be performed after a DC winding resistance test, the effects of residual magnetism would affect the phase pattern leading to uncertainties on the diagnostic criteria.

Demagnetization

Residual magnetism can then be removed through a procedure known as demagnetization. Historically, demagnetization included subjecting the core to sequential reversals of core magnetization. It starts at the main hysteresis loop level followed by a series of reduced levels of magnetization.

The process of demagnetizing the transformer requires a different set of equipment, which is not always available. And even when the different set of equipment is available, a different test configuration is required with different leads brought up to the top of the transformer. If the determination that the results were affected by a magnetized core was made during a review after the testing was complete and after the transformer returned to service, the opportunity to demagnetize the core can easily be lost.

Optimizing Transformer Exciting Current and Loss Test Results

The methodology disclosed herein to optimize the exciting current and loss test results by dynamically managing the magnetic state of the core eliminates the need to demagnetize the transformer with a different test set and/or setup.

Figure 5:
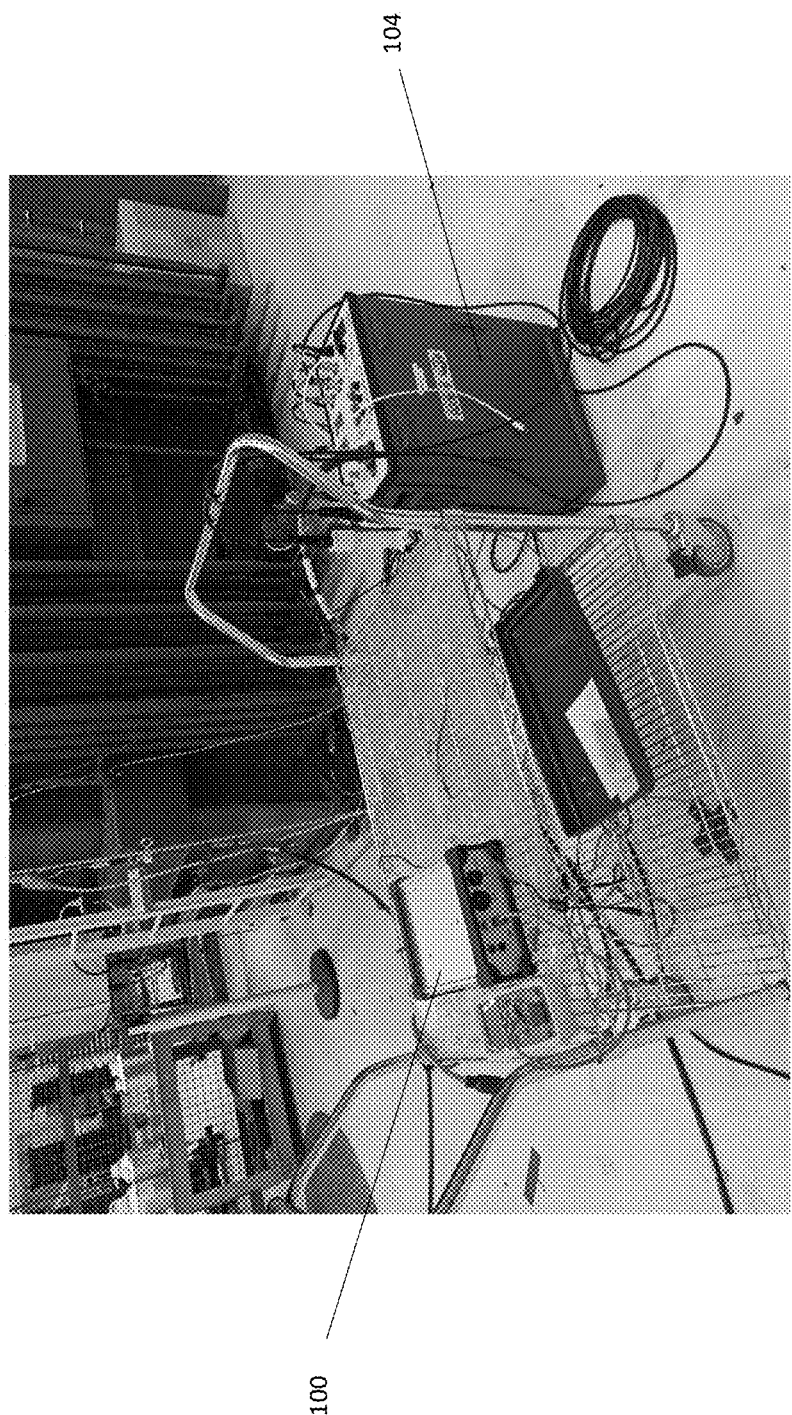
FIG. 5 shows an example test in progress including the prototype module shown in FIG. 4 being used in series with an insulation analyzer.

In exemplary embodiments, a relatively small, isolated DC voltage source (e.g., an external module as shown in FIG. 4, other DC supply, etc.) is electrically connected in series with an isolated, AC coupled primary high voltage supply (e.g., 10 kVrms supply, high voltage supply shown in FIG. 5, etc.). The DC voltage source is electrically connected in series with a test circuit employed to measure exciting current and losses.

The DC voltage source is configured to be operable for injecting a DC offset voltage. The DC voltage source is configured with the capability to support the maximum current the primary supply can provide. The DC voltage source is also configured with the ability to be bypassed with a relay when its function is complete. In this exemplary embodiment, the method includes injecting the DC offset voltage, adjusting the polarity and magnitude of the DC source while monitoring the RMS value of the AC current for a minimum, then bypassing the DC source when the minimum has been reached (or some other appropriate evaluation). At that point, the process to record the characteristics of the exciting current can proceed as normal.

The injection of the varying DC offset voltage during the exciting current and loss test creates an extra component to the external magnetic field being created by the test current. This extra component facilitates the rotation of magnetic domains, which translate in a reduction of the residual magnetism once the test voltage is removed.

FIG. 4 shows a prototype of an external module 100 (isolated DC voltage source) connectable in series with a test circuit employed to measure exciting current and losses according to exemplary embodiments of the present disclosure. The external module 100 is operable for injecting a varying DC offset voltage during the exciting current and loss test to thereby create an extra component to the external magnetic field being created by the test current. The extra component facilitates the rotation of magnetic domains, which translate in a reduction of the residual magnetism once the test voltage is removed.

FIG. 5 shows an example test in progress including the prototype module 100 (FIG. 4) being used in series with an insulation analyzer 104 (e.g., insulation analyzer M4000, etc.). During the exciting current test, the voltage of the DC source 100 can be set to positive or negative values, e.g., via the rotary selector switch knob 108 shown in FIG. 4, etc. The test current is monitored while the polarity of the test current is changed depending on the slope. The objective is to establish a minimum measured current (or other appropriate criteria) that will correspond to the state of less magnetic bias in the core of the transformer. When this objective is achieved, the exciting current and losses can be then measured without the effects of residual magnetism in the core of the transformer being tested. By way of example, the monitoring of the test current and changing of the polarity may be a manual process in which the test current is monitored manually by an operator while the operator manually changes the polarity of the test current depending on the slope. Additionally, or alternatively, the monitoring of the test current and changing of the polarity may be an automatic process in which the test current is monitored automatically (e.g., via software control, etc.) while the polarity of the test current is changed automatically (e.g., via software control, etc.) without requiring manual operation from an operator.

FIG. 6 includes example test results obtained by using the prototype module 100 (FIG. 4) while performing an exciting current and loss test on a 110 kilovolt (kV) to 22.9 kV and 2.5 megavolt-ampere (MVA) transformer.

The first row of test results for the on-load tap changing transformer (OLTC 16L) corresponds to exciting current and loss results in the condition "as found". Both currents (milliamps) and loss (Watts) readings show a typical pattern of High-Low-High. More specifically, the higher current and loss readings are on the outer phases (H3-H1 and H2-H3). The lower current reading (2.919 mA) and lower loss reading (25.639 W) are exhibited on the center phase (H2-H1). Symmetry on the measurements is recognized (e.g., via software, etc.) and a rating is assigned based on the recognition of the phase pattern. This first set of test results was assigned a "Good" rating, which means that the expected phase pattern has been recognized.

The second row of test results for the on-load tap changing transformer (OLTC 16L) corresponds to exciting current and loss results after performing a DC winding resistance test on H3-H1, which magnetized the core. The residual magnetism creates an increase of measured current on that same phase. In this case, H3-H1 shows a current of 9.519 mA, which is about 11% higher than the current of 8.559 mA measured on H2-H3. As shown in FIG. 6, this is recognized (e.g., via software, etc.) as "not confirming to a known phase pattern" and an "Investigate" rating is assigned.

The third row of test results for the on-load tap changing transformer (OLTC 16L) shows test results after using the prototype external module 100 (FIGS. 4 and 5) and the methodology disclosed herein. As observed, the currents conform to an expected pattern of two high readings on the outer phases (H3-H1 and H2-H3) and one lower reading on the center phase (H1-H2). It is also observed that the magnitudes of the currents on the outer phases are lower after using the prototype external module 100 and methodology disclosed herein as compared with the first row of test results for "as found" condition. This indicates that the magnetic state of the core was driven to a point of minimum residual magnetism $B_r$ than the initial state, which is a signal of a clear removal of such magnetism by the prototype external module 100 and methodology disclosed herein.

FIG. 7 is a line graph of measured exciting current in milliamps (mA RMS) and DC voltage in volts (V) versus Time. FIG. 7 shows the behavior of the measured current on phase H3-H1 with respect to DC voltage. The X-axis of the line graph corresponds to the time in seconds.

The blue solid line corresponds to measured exciting current versus time. The peaks along the solid line where the current shows higher values represent a magnetized state of the core. The valleys along the solid line at which the RMS current is lower represent a demagnetized state of the core. As shown in FIG. 7, positive and negative DC voltages can drive the core to saturation in a similar manner. The point of less magnetic bias (minimum measured RMS current) can be determined by observing or analyzing the behavior of the RMS current. And, the DC voltage can be turned off to thereby enable the measurement of the exciting current with a demagnetized core. This may include a manual process in which an operator, by observing or looking at the behavior of the current, can determine the point of less magnetic bias (minimum measured RMS current), manually turn the DC voltage off, and proceed with the measurement of the exciting current with a demagnetized core. Additionally, or alternatively, this may include an automated process in which the behavior of the current is analyzed by a system to determine the point of less magnetic bias (minimum measured current), and in response, the system automatically (e.g., via software control, etc.) turns the DC voltage off and proceeds with the measurement of the exciting current with a demagnetized core.

FIG. 8 illustrates an exemplary method 220 for optimizing transformer exciting current and loss test results by dynamically managing core magnetic state according to exemplary embodiments of the present disclosure. At 222, the method 220 includes configuring the instrument and ramp to test voltage with DC offset voltage set to 0.0 VDC. The DC offset voltage is then changed to a nominal positive value (e.g., 5 to 50 VDC, etc.) at 224.

At 226, the method includes 220 measuring the rate of change of current. If the current is increasing, then the method 220 proceeds to 228 at which the DC offset voltage polarity is reversed, and the method returns to 226. But if the measured current at 226 is decreasing, then the method 220 proceeds to 230 to wait for a current minimum while the current is monitored.

If the monitored current at 230 is past or exceeds the minimum, the voltage is reduced by half at 232 and the method returns to 228 at which the DC offset voltage polarity is reversed. But if the monitored current is at the minimum at 230, then the method 220 proceeds to 234 at which the DC offset voltage is set to 0.0 DVC, to thereby enable bypassing the DC source. The method 220 then proceeds to 236 at which the exciting current and losses can be measured without the effects of residual magnetism in the core of the transformer being tested.

FIG. 9 illustrates a system 340 for optimizing transformer exciting current and loss test results by dynamically managing core magnetic state according to an exemplary embodiment. The system 340 includes a digital to analog converter (DAC) 342 within an isolated driver circuit 344, a step-up transformer 360, a main processor 350, and at least one relay 352.

The digital to analog converter 342 is operable for feeding the isolated driver circuit 344. The isolated driver circuit 344 is coupled with a low voltage side of the high voltage winding of the step-up transformer 360. The digital to analog converter 342 is also coupled with a measurement reference point (Guard) 348.

The system 340 is digitally controllable via the main processor 350, which provides digital controls. The main processor 350 is coupled and in communication with the low voltage source 354 and the device 356 that includes measurement channels.

The relay 352 is available on the output to connect the low voltage side of the high voltage winding of the step-up transformer 360 directly to the Guard 348 of the relay matrix 358, thereby bypassing the isolated driver circuit 344. The relay matrix 358 is coupled with or includes a measurement lead 359 for connection with the transformer under test. The step-up transformer 360 is coupled with the low voltage source 354 and the isolated driver circuit 344.

With continued reference to FIG. 9, the step-up transformer 360 is operable for providing the high voltage within the system 340. The main reference or device 364 (e.g., resistive divider, capacitive divider, etc.) is operable for measuring the output voltage. The output voltage as measured by the main reference 364 and the measured current from the measurement lead 359 are used to perform the calculations for the exciting current results.

FIG. 10 illustrates details of the driver circuit 344 shown in FIG. 9 according to an exemplary embodiment of the present disclosure. As shown in FIG. 10, the driver circuit 344 includes an output relay control 362 configured to be operable for controlling operational (closed or open) status of the relay 352. The driver circuit 344 also includes a digital isolator 364 and a power isolator 365. The digital to analog converter (DAC) 342 is coupled in series with the digital isolator 364, a low pass filter 366, and an operational amplifier (Op-Amp) 368.

FIG. 11 illustrates a system 440 for optimizing transformer exciting current and loss test results by dynamically managing core magnetic state according to another exemplary embodiment of the present disclosure. In this exemplary embodiment, the system 440 includes a reversible DC source 442 that is part of an isolated driver circuit 444. The reversible DC source 442 may comprise a fixed value isolated DC source.

The isolated driver circuit 444 is coupled with a low voltage side of a high voltage winding of a step-up transformer 460. The isolated driver circuit 444 is also coupled with a measurement reference point (Guard) 448.

The system 440 is digitally controllable via the main processor 450, which provides digital controls. The main processor 450 is coupled and in communication with the low voltage source 454 and the device 456 that includes measurement channels.

The system 440 further includes at least one relay 452 available on the output to connect the low voltage side of the high voltage winding of the step-up transformer 460 directly to the Guard 448 of the relay matrix 458, thereby bypassing the isolated driver circuit 444. The relay matrix 458 is coupled with or includes a measurement lead 459 for connection with the transformer under test.

FIG. 12 illustrates details of the driver circuit 444 shown in FIG. 11 according to an exemplary embodiment of the present disclosure. As shown in FIG. 12, the driver circuit 444 includes a digital isolator 464 and a power isolator 465. The digital isolator 464 is between the DC supply 442 and DC control.

The DC supply 442 is between the digital isolator 464 and first and second relays 472 and 474. The first and second relays 472 and 474 are configured to allow the output of the isolated driver circuit 444 to be electrically connected in the circuit with either a positive polarity or a negative polarity.

FIG. 13 illustrates a system 540 for optimizing transformer exciting current and loss test results by dynamically managing core magnetic state according to another exemplary embodiment of the present disclosure. In this exemplary embodiment, the system 540 includes a digital potentiometer 542 that is part of an isolated driver circuit 544.

The isolated driver circuit 544 is coupled with a low voltage side of the high voltage winding of the step-up transformer 560. The isolated driver circuit 544 is also coupled with a measurement reference point (Guard) 548.

The system 540 is digitally controllable via the main processor 550, which provides digital controls. The main processor 550 is coupled and in communication with the low voltage source 554 and the device 556 that includes measurement channels.

At least one relay 552 is available on the output to connect the low voltage side of the high voltage winding of the step-up transformer 560 directly to the Guard 548 of the relay matrix 558, thereby bypassing the isolated driver circuit 544. The relay matrix 558 is coupled with or includes a measurement lead 559 for connection with the transformer under test. The step-up transformer 560 is coupled with the low voltage source 554 and the isolated driver circuit 544.

FIG. 14 illustrates details of the driver circuit 544 shown in FIG. 13 according to an exemplary embodiment of the present disclosure. As shown in FIG. 14, the driver circuit 544 includes an output relay control 562 configured to be operable for controlling operational (closed or open) status of the relay 552. The driver circuit 544 also includes a digital isolator 564 and a power isolator 565. The digital potentiometer 542 is coupled in series with the digital isolator 564, a low pass filter 566, and an operational amplifier (Op-Amp) 568.

FIG. 15 illustrates a system 640 for optimizing transformer exciting current and loss test results by dynamically managing core magnetic state according to another exemplary embodiment of the present disclosure. In this exemplary embodiment, the system 640 includes a DC coupled high voltage source 670 that allows for combining of a high voltage AC signal and a low voltage DC through a single supply. The DC coupled high voltage source 670 comprises a high voltage DC coupled amplifier in this illustrated embodiment.

The DC coupled high voltage source 670 is coupled with a measurement reference point (Guard) 648 of the relay matrix 658. The relay matrix 658 is coupled with or includes a measurement lead 659 for connection with the transformer under test. The system 640 is digitally controllable via the main processor 650, which provides digital controls. The main processor 650 is coupled and in communication with the DC coupled high voltage source 670 and the device 656 that includes measurement channels.

FIG. 16 illustrates a system 740 for optimizing transformer exciting current and loss test results by dynamically managing core magnetic state according to another exemplary embodiment of the present disclosure. In this exemplary embodiment, the system 740 includes a DC injection circuit 744 coupled with a test instrument 776 via a measurement lead 759. The DC injection circuit 744 is also coupled with a device under test (DUT) 778 (e.g., a transformer, etc.). The test instrument 776 and DUT 778 are coupled via a high voltage lead 780. In this case, the DC injection circuit 744 is a standalone piece of equipment, operating independently from the test instrument.

FIG. 17 illustrates details of the driver circuit 744 shown in FIG. 16 according to an exemplary embodiment of the present disclosure. As shown in FIG. 17, the driver circuit 744 includes a driver 742 coupled with the relay 752, which is controllable by an output relay control 762. The driver circuit 744 also includes a gain/polarity control 782, a comparator 784, a differentiator 786, an AC to RMS converter 788, and an operational amplifier (Op-Amp) 790 coupled in series with the relay 752.

The driver circuit 744 further includes a relay 772 configured to allow the output of the DC injection circuit 744 to be electrically connected in the circuit with either a positive polarity or a negative polarity. A low pass filter 766 is between the relay 772 and a programmable gain amplifier (PGA) 768.

Accordingly, disclosed herein are systems and methods for optimizing transformer exciting current and loss test results by dynamically managing core magnetic state. In exemplary embodiments, a method includes injecting a direct current (DC) offset voltage; adjusting at least one of a polarity and a magnitude of the DC offset voltage while monitoring a test current for one or more criteria; and bypassing a source of the DC offset voltage when the test current has satisfied the one or more criteria, whereby residual magnetism, if any, of the core of the transformer is minimized.

In exemplary embodiments, the method reduces residual magnetism of the core of the transformer thereby enabling optimization of the exciting current and loss test results of the transformer without the effects of the residual magnetism in the core and without requiring an independent demagnetization of the transformer.

In exemplary embodiments, the method includes proceeding with the exciting current and loss testing of the transformer after reduction of the residual magnetism of the core of the transformer to a minimum residual magnetism.

In exemplary embodiments, injecting the DC offset voltage comprises injecting the DC offset voltage via a DC voltage source in series with an alternating current (AC) coupled voltage supply; and adjusting at least one of a polarity and a magnitude of the DC offset voltage comprises reversing polarity and adjusting magnitude of the DC voltage source.

In exemplary embodiments, the method includes: (A) monitoring a rate of change of the test current. If the monitored rate of change of the test current is increasing, then the method includes (a) reversing polarity of the DC offset voltage and the method returns to (A) monitoring a rate of change of the test current. Or, if the monitored rate of change of the test current is decreasing, then the method includes waiting for the test current to reach a minimum. And, if the test current is past the minimum, then the method includes reducing voltage by a predetermined amount and the method returns to (a) reversing polarity of the DC offset voltage; or if the test current is at the minimum or about at the minimum (e.g., within 1% of the minimum, etc.), then the method includes setting the DC offset voltage to zero to bypass the source of the DC offset voltage. In exemplary embodiments, the method further includes (B) proceeding with the exciting current testing of the transformer after setting the DC offset voltage to zero to bypass the source of the DC offset voltage.

In exemplary embodiments, injecting of the DC offset voltage creates an extra component to an external magnetic field being created by the test current, which said extra component facilitates rotation of magnetic domains that translates in a reduction of residual magnetism of the core of the transformer after bypassing and removing of test voltage of the source of the DC offset voltage.

In exemplary embodiments, the one or more criteria comprises a test current minimum corresponding with a state of less magnetic bias and/or a demagnetized state of the core of the transformer. And, the method includes bypassing the source of the DC offset voltage when the test current has reached the test current minimum. By way of example only, the test current minimum may be within a range from about 1 mA to 300 mA for a 10 Kv exciting voltage.

In exemplary embodiments, bypassing the source of the DC offset voltage when the test current has satisfied the one or more criteria comprises using a relay to bypass the source of the DC offset voltage.

In exemplary embodiments, bypassing the source of the DC offset voltage when the test current has satisfied the one or more criteria comprises setting the DC offset voltage to 0 VDC.

In exemplary embodiments, a system is configured to be operable for dynamically managing magnetic state of a core of a transformer to enable optimization of exciting current test results of the transformer. The system comprises a direct current (DC) voltage source connectable with an alternating current (AC) coupled voltage supply. The DC voltage source is configured to support a maximum current supplied by the AC coupled voltage supply. The DC voltage source is configured to be operable for injecting a DC offset voltage. The system is configured to allow adjustment to at least one of a polarity and a magnitude of the DC offset voltage from the DC voltage source while monitoring a test current for one or more criteria. The system is also configured to allow bypassing of the DC voltage source when the test current has satisfied the one or more criteria, whereby residual magnetism, if any, of the core of the transformer is minimized.

In exemplary embodiments, the DC voltage source is configured to be operable for injecting the DC offset voltage to create an extra component to an external magnetic field being created by the test current. The extra component facilitates rotation of magnetic domains that translates in a reduction of residual magnetism after removal of the test voltage from the DC voltage source.

In exemplary embodiments, the one or more criteria comprises a test current minimum corresponding with a state of less magnetic bias and/or a demagnetized state of the core of the transformer. The system is configured to allow bypassing of the DC voltage source when the test current has reached the test current minimum. By way of example only, the test current minimum may be within a range from about 1 mA to 300 mA for a 10 Kv exciting voltage.

In exemplary embodiments, the system comprises at least one relay for selectively bypassing the DC voltage source when the test current has satisfied the one or more criteria.

In exemplary embodiments, the DC voltage source comprises an isolated driver circuit including a digital to analog converter, a reversible DC source, or a digital potentiometer.

In exemplary embodiments, the DC voltage source comprises an isolated driver circuit. A step-up transformer is coupled with a low voltage source and the isolated driver circuit. A relay matrix includes a measurement reference point and a measurement lead for connection with the transformer under test. A device including one or more measurement channels is coupled with the relay matrix. A processor is configured for digitally controlling the system. The processor is coupled with the low voltage source, the isolated driver circuit, and the device including the one or more measurement channels. At least one relay on an output of the isolated driver circuit is configured to connect a low voltage side of a high voltage winding of the step-up transformer to the measurement reference point to thereby bypass the isolated driver circuit.

In exemplary embodiments, the DC voltage source comprises an isolated driver circuit including at least one relay on an output of the isolated driver circuit; an output relay control configured to be operable for controlling operational status of the at least one relay for selectively bypassing the isolated driver circuit; a digital isolator; a power isolator; a low pass filter; an operational amplifier; and a digital to analog converter operable for feeding the isolated driver circuit. The digital to analog converter is coupled in series with the digital isolator, the low pass filter, and the operational amplifier.

In exemplary embodiments, the DC voltage source comprises an isolated driver circuit including a reversible DC supply operable for feeding the isolated driver circuit; a power isolator; a digital isolator between the reversible DC supply and a DC control; first and second relays coupled with the reversible DC supply; and a third relay on an output of the isolated driver circuit to selectively bypass the isolated driver circuit. The first and second relays are configured to allow an output of the isolated driver circuit to be electrically connected with either a positive polarity or a negative polarity.

In exemplary embodiments, the DC voltage source comprises an isolated driver circuit including at least one relay on an output of the isolated driver circuit; an output relay control configured to be operable for controlling operational status of the at least one relay for selectively bypassing the isolated driver circuit; a digital isolator; a power isolator; a low pass filter; an operational amplifier; and a digital potentiometer operable for feeding the isolated driver circuit. The digital potentiometer is coupled in series with the digital isolator, the low pass filter, and the operational amplifier.

In exemplary embodiments, the DC voltage source comprises a DC coupled high voltage source configured to be operable for combining a high voltage AC signal and a low voltage DC through a single supply.

In exemplary embodiments, the DC voltage source comprises a high voltage DC coupled amplifier. The system includes a relay matrix including a measurement reference point and a measurement lead for connection with the transformer under test. The high voltage DC coupled amplifier coupled with the measurement reference point. A device including one or more measurement channels is coupled with the relay matrix. A processor is configured for digitally controlling the system. The processor is coupled with the high voltage DC coupled amplifier and the device including the one or more measurement channels.

In exemplary embodiments, the DC voltage source comprises a DC injection circuit configured for connection with a test instrument and a device under test. The DC injection circuit includes a first relay on an output of the DC injection circuit; an output relay control configured to be operable for controlling operational status of the first relay for selectively bypassing the DC injection circuit; a power isolator; a driver coupled with the first relay; a gain/polarity control; a comparator; a differentiator; an AC to RMS converter; an operational amplifier coupled with the first relay and coupled in series with the AC to RMS converter, the differentiator, the comparator, and the gain/polarity control; a programmable gain amplifier coupled with the driver and gain control of the gain/polarity control; a low pass filter coupled with the programmable gain amplifier; and a second relay coupled with the low pass filter and polarity control of the gain/polarity control.

Aspects of the systems and methods disclosed herein may be implemented with various transformers and other DUTs (devices under test). Accordingly, exemplary systems and methods disclosed herein should not be limited to use with any one particular type or size of transformer or device under test. By way of example only, a test was performed on a 110 kV delta-wye transformer. During this test, a DC bench supply was put in series with the return lead during a 10 kV exciting current test. An ammeter was used to measure and log the actual current. The voltage from the DC supply was adjusted back and forth from +10 to −10 VDC, and the effect on the current in the loop was monitored. It was found that a minimum current was measured at what was considered a centered B-H curve.

Advantages of being able to demagnetize the transformer's core while performing the exciting current and loss measurements include obtaining test results that truly represent the condition of the transformer and that are unaffected by the state of magnetization of the core. This is achieved without the need for additional equipment or leads to demagnetize the transformer. The process will require an amount of time (e.g., 10 to 20 seconds, etc.) to run, which will depend on the voltage rating of the transformer being tested. This additional time is considerably less than what would be necessary to demagnetize the transformer using a different test set. If a transformer is being tested on multiple OLTC positions, the process may only have to be run once per phase on the first tap position.

Example embodiments are provided so that this disclosure will be thorough and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected, or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer, or section. Terms such as "first," "second," and other numerical terms when used herein do not imply a sequence or order unless clearly indicated by the context. Thus, a first element, component, region, layer, or section discussed below could be termed a second element, component, region, layer, or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A method for optimizing exciting current and loss test results of a transformer by dynamically managing core magnetic state, the method comprising:
   injecting a direct current (DC) offset voltage;
   adjusting at least one of a polarity and a magnitude of the DC offset voltage while monitoring a test current for one or more criteria; and
   bypassing a source of the DC offset voltage when the test current has satisfied the one or more criteria, whereby residual magnetism, if any, of a core of the transformer is minimized;
   wherein the method reduces residual magnetism of the core of the transformer thereby enabling optimization of the exciting current and loss test results of the transformer without the effects of the residual magnetism in the core and without requiring an independent demagnetization of the transformer.

2. A method for optimizing exciting current and loss test results of a transformer by dynamically managing core magnetic state, the method comprising:
   injecting a direct current (DC) offset voltage;

adjusting at least one of a polarity and a magnitude of the DC offset voltage while monitoring a test current for one or more criteria; and bypassing a source of the DC offset voltage when the test current has satisfied the one or more criteria, whereby residual magnetism, if any, of a core of the transformer is minimized;

wherein the method includes proceeding with the exciting current and loss testing of the transformer after reduction of the residual magnetism of the core of the transformer to a minimum residual magnetism.

3. A method for optimizing exciting current and loss test results of a transformer by dynamically managing core magnetic state, the method comprising:

injecting a direct current (DC) offset voltage;

adjusting at least one of a polarity and a magnitude of the DC offset voltage while monitoring a test current for one or more criteria; and bypassing a source of the DC offset voltage when the test current has satisfied the one or more criteria, whereby residual magnetism, if any, of a core of the transformer is minimized;

wherein:

injecting the DC offset voltage comprises injecting the DC offset voltage via a DC voltage source in series with an alternating current (AC) coupled voltage supply; and adjusting at least one of a polarity and a magnitude of the DC offset voltage comprises reversing polarity and adjusting magnitude of the DC voltage source.

4. A method for optimizing exciting current and loss test results of a transformer by dynamically managing core magnetic state, the method comprising:

injecting a direct current (DC) offset voltage;

adjusting at least one of a polarity and a magnitude of the DC offset voltage while monitoring a test current for one or more criteria; and bypassing a source of the DC offset voltage when the test current has satisfied the one or more criteria, whereby residual magnetism, if any, of a core of the transformer is minimized; wherein the method includes:

(A) monitoring a rate of change of the test current;
  (i) if the monitored rate of change of the test current is increasing, then the method includes (a) reversing polarity of the DC offset voltage and the method returns to (A) monitoring a rate of change of the test current; or
  (ii) if the monitored rate of change of the test current is decreasing, then the method includes waiting for the test current to reach a minimum; and
    if the test current is past the minimum, then the method includes reducing voltage by a predetermined amount and the method returns to (a) reversing polarity of the DC offset voltage; or
    if the test current is at or about at the minimum, then the method includes setting the DC offset voltage to zero to bypass the source of the DC offset voltage.

5. The method of claim 4, further comprising (B) proceeding with the exciting current testing of the transformer after setting the DC offset voltage to zero to bypass the source of the DC offset voltage.

6. A method for optimizing exciting current and loss test results of a transformer by dynamically managing core magnetic state, the method comprising:

injecting a direct current (DC) offset voltage;

adjusting at least one of a polarity and a magnitude of the DC offset voltage while monitoring a test current for one or more criteria; and bypassing a source of the DC offset voltage when the test current has satisfied the one or more criteria, whereby residual magnetism, if any, of a core of the transformer is minimized;

wherein the injecting of the DC offset voltage creates an extra component to an external magnetic field being created by the test current, which said extra component facilitates rotation of magnetic domains that translates in a reduction of residual magnetism of the core of the transformer after bypassing and removing of test voltage of the source of the DC offset voltage.

7. A method for optimizing exciting current and loss test results of a transformer by dynamically managing core magnetic state, the method comprising:

injecting a direct current (DC) offset voltage;

adjusting at least one of a polarity and a magnitude of the DC offset voltage while monitoring a test current for one or more criteria; and bypassing a source of the DC offset voltage when the test current has satisfied the one or more criteria, whereby residual magnetism, if any, of a core of the transformer is minimized;

wherein:

the one or more criteria comprises a test current minimum corresponding with a state of less magnetic bias and/or a demagnetized state of the core of the transformer; and the method includes bypassing the source of the DC offset voltage when the test current has reached the test current minimum.

8. A method for optimizing exciting current and loss test results of a transformer by dynamically managing core magnetic state, the method comprising:

injecting a direct current (DC) offset voltage;

adjusting at least one of a polarity and a magnitude of the DC offset voltage while monitoring a test current for one or more criteria; and bypassing a source of the DC offset voltage when the test current has satisfied the one or more criteria, whereby residual magnetism, if any, of a core of the transformer is minimized;

wherein bypassing the source of the DC offset voltage when the test current has satisfied the one or more criteria comprises using a relay to bypass the source of the DC offset voltage.

9. A method for optimizing exciting current and loss test results of a transformer by dynamically managing core magnetic state, the method comprising:

injecting a direct current (DC) offset voltage;

adjusting at least one of a polarity and a magnitude of the DC offset voltage while monitoring a test current for one or more criteria; and bypassing a source of the DC offset voltage when the test current has satisfied the one or more criteria, whereby residual magnetism, if any, of a core of the transformer is minimized;

wherein bypassing the source of the DC offset voltage when the test current has satisfied the one or more criteria comprises setting the DC offset voltage to 0 VDC.

10. A system configured to be operable for dynamically managing magnetic state of a core of a transformer to enable optimization of exciting current test results of the transformer, the system comprising:

a direct current (DC) voltage source connectable with an alternating current (AC) coupled voltage supply, the DC voltage source configured to support a maximum current supplied by the AC coupled voltage supply, the DC voltage source configured to be operable for injecting a DC offset voltage;

wherein the system is configured to allow:
adjustment to at least one of a polarity and a magnitude of the DC offset voltage from the DC voltage source while monitoring a test current for one or more criteria; and
bypassing of the DC voltage source when the test current has satisfied the one or more criteria, whereby residual magnetism, if any, of the core of the transformer is minimized;

wherein the DC voltage source is configured to be operable for injecting the DC offset voltage to create an extra component to an external magnetic field being created by the test current, which said extra component facilitates rotation of magnetic domains that translates in a reduction of residual magnetism after removal of test voltage from the DC voltage source.

11. A system configured to be operable for dynamically managing magnetic state of a core of a transformer to enable optimization of exciting current test results of the transformer, the system comprising:

a direct current (DC) voltage source connectable with an alternating current (AC) coupled voltage supply, the DC voltage source configured to support a maximum current supplied by the AC coupled voltage supply, the DC voltage source configured to be operable for injecting a DC offset voltage;

wherein the system is configured to allow:
adjustment to at least one of a polarity and a magnitude of the DC offset voltage from the DC voltage source while monitoring a test current for one or more criteria; and
bypassing of the DC voltage source when the test current has satisfied the one or more criteria, whereby residual magnetism, if any, of the core of the transformer is minimized;

wherein:
the one or more criteria comprises a test current minimum corresponding with a state of less magnetic bias and/or a demagnetized state of the core of the transformer; and
the system is configured to allow bypassing of the DC voltage source when the test current has reached the test current minimum.

12. A system configured to be operable for dynamically managing magnetic state of a core of a transformer to enable optimization of exciting current test results of the transformer, the system comprising:

a direct current (DC) voltage source connectable with an alternating current (AC) coupled voltage supply, the DC voltage source configured to support a maximum current supplied by the AC coupled voltage supply, the DC voltage source configured to be operable for injecting a DC offset voltage;

wherein the system is configured to allow:
adjustment to at least one of a polarity and a magnitude of the DC offset voltage from the DC voltage source while monitoring a test current for one or more criteria; and
bypassing of the DC voltage source when the test current has satisfied the one or more criteria, whereby residual magnetism, if any, of the core of the transformer is minimized;

wherein the system comprises at least one relay for selectively bypassing the DC voltage source when the test current has satisfied the one or more criteria.

13. A system configured to be operable for dynamically managing magnetic state of a core of a transformer to enable optimization of exciting current test results of the transformer, the system comprising:

a direct current (DC) voltage source connectable with an alternating current (AC) coupled voltage supply, the DC voltage source configured to support a maximum current supplied by the AC coupled voltage supply, the DC voltage source configured to be operable for injecting a DC offset voltage;

wherein the system is configured to allow:
adjustment to at least one of a polarity and a magnitude of the DC offset voltage from the DC voltage source while monitoring a test current for one or more criteria; and
bypassing of the DC voltage source when the test current has satisfied the one or more criteria, whereby residual magnetism, if any, of the core of the transformer is minimized;

wherein the DC voltage source comprises an isolated driver circuit including a digital to analog converter, a reversible DC source, or a digital potentiometer.

14. A system configured to be operable for dynamically managing magnetic state of a core of a transformer to enable optimization of exciting current test results of the transformer, the system comprising:

a direct current (DC) voltage source connectable with an alternating current (AC) coupled voltage supply, the DC voltage source configured to support a maximum current supplied by the AC coupled voltage supply, the DC voltage source configured to be operable for injecting a DC offset voltage;

wherein the system is configured to allow:
adjustment to at least one of a polarity and a magnitude of the DC offset voltage from the DC voltage source while monitoring a test current for one or more criteria; and
bypassing of the DC voltage source when the test current has satisfied the one or more criteria, whereby residual magnetism, if any, of the core of the transformer is minimized;

wherein the DC voltage source comprises an isolated driver circuit, and wherein the system includes:
a low voltage source;
a step-up transformer coupled with the low voltage source and the isolated driver circuit;
a relay matrix including a measurement reference point and a measurement lead for connection with the transformer under test;
a device including one or more measurement channels and coupled with the relay matrix;
a processor configured for digitally controlling the system, the processor coupled with the low voltage source, the isolated driver circuit, and the device including the one or more measurement channels; and
at least one relay on an output of the isolated driver circuit and configured to connect a low voltage side of a high voltage winding of the step-up transformer to the measurement reference point to thereby bypass the isolated driver circuit.

15. The system of claim 13, wherein the DC voltage source comprises the isolated driver circuit including:
  at least one relay on an output of the isolated driver circuit;
  an output relay control configured to be operable for controlling operational status of the at least one relay for selectively bypassing the isolated driver circuit;
  a digital isolator;
  a power isolator;
  a low pass filter;
  an operational amplifier; and
  the digital to analog converter operable for feeding the isolated driver circuit, the digital to analog converter is coupled in series with the digital isolator, the low pass filter, and the operational amplifier.

16. A system configured to be operable for dynamically managing magnetic state of a core of a transformer to enable optimization of exciting current test results of the transformer, the system comprising:
  a direct current (DC) voltage source connectable with an alternating current (AC) coupled voltage supply, the DC voltage source configured to support a maximum current supplied by the AC coupled voltage supply, the DC voltage source configured to be operable for injecting a DC offset voltage;
  wherein the system is configured to allow:
    adjustment to at least one of a polarity and a magnitude of the DC offset voltage from the DC voltage source while monitoring a test current for one or more criteria; and
    bypassing of the DC voltage source when the test current has satisfied the one or more criteria, whereby residual magnetism, if any, of the core of the transformer is minimized;
  wherein the DC voltage source comprises an isolated driver circuit including:
    a reversible DC supply operable for feeding the isolated driver circuit;
    a power isolator;
    a digital isolator between the reversible DC supply and a DC control;
    first and second relays coupled with the reversible DC supply, the first and second relays configured to allow an output of the isolated driver circuit to be electrically connected with either a positive polarity or a negative polarity; and
    a third relay on an output of the isolated driver circuit to selectively bypass the isolated driver circuit.

17. The system of claim 13, wherein the DC voltage source comprises the isolated driver circuit including:
  at least one relay on an output of the isolated driver circuit;
  an output relay control configured to be operable for controlling operational status of the at least one relay for selectively bypassing the isolated driver circuit;
  a digital isolator;
  a power isolator;
  a low pass filter;
  an operational amplifier; and
  the digital potentiometer operable for feeding the isolated driver circuit, the digital potentiometer is coupled in series with the digital isolator, the low pass filter, and the operational amplifier.

18. A system configured to be operable for dynamically managing magnetic state of a core of a transformer to enable optimization of exciting current test results of the transformer, the system comprising:
  a direct current (DC) voltage source connectable with an alternating current (AC) coupled voltage supply, the DC voltage source configured to support a maximum current supplied by the AC coupled voltage supply, the DC voltage source configured to be operable for injecting a DC offset voltage;
  wherein the system is configured to allow:
    adjustment to at least one of a polarity and a magnitude of the DC offset voltage from the DC voltage source while monitoring a test current for one or more criteria; and
    bypassing of the DC voltage source when the test current has satisfied the one or more criteria, whereby residual magnetism, if any, of the core of the transformer is minimized;
  wherein the DC voltage source comprises a DC coupled high voltage source configured to be operable for combining a high voltage AC signal and a low voltage DC through a single supply.

19. A system configured to be operable for dynamically managing magnetic state of a core of a transformer to enable optimization of exciting current test results of the transformer, the system comprising:
  a direct current (DC) voltage source connectable with an alternating current (AC) coupled voltage supply, the DC voltage source configured to support a maximum current supplied by the AC coupled voltage supply, the DC voltage source configured to be operable for injecting a DC offset voltage;
  wherein the system is configured to allow:
    adjustment to at least one of a polarity and a magnitude of the DC offset voltage from the DC voltage source while monitoring a test current for one or more criteria; and
    bypassing of the DC voltage source when the test current has satisfied the one or more criteria, whereby residual magnetism, if any, of the core of the transformer is minimized;
  wherein the DC voltage source comprises a high voltage DC coupled amplifier, and wherein the system includes:
    a relay matrix including a measurement reference point and a measurement lead for connection with the transformer under test, the high voltage DC coupled amplifier coupled with the measurement reference point;
    a device including one or more measurement channels and coupled with the relay matrix; and
    a processor configured for digitally controlling the system, the processor coupled with the high voltage DC coupled amplifier and the device including the one or more measurement channels.

20. A system configured to be operable for dynamically managing magnetic state of a core of a transformer to enable optimization of exciting current test results of the transformer, the system comprising:
  a direct current (DC) voltage source connectable with an alternating current (AC) coupled voltage supply, the DC voltage source configured to support a maximum current supplied by the AC coupled voltage supply, the DC voltage source configured to be operable for injecting a DC offset voltage;
  wherein the system is configured to allow:
    adjustment to at least one of a polarity and a magnitude of the DC offset voltage from the DC voltage source while monitoring a test current for one or more criteria; and bypassing of the DC voltage source when the test current has satisfied the one or more criteria, whereby residual magnetism, if any, of the core of the transformer is minimized;

wherein the DC voltage source comprises a DC injection circuit configured for connection with a test instrument and a device under test, the DC injection circuit including:

a first relay on an output of the DC injection circuit;

an output relay control configured to be operable for controlling operational status of the first relay for selectively bypassing the DC injection circuit;

a power isolator;

a driver coupled with the first relay;

a gain/polarity control;

a comparator;

a differentiator;

an AC to RMS converter;

an operational amplifier coupled with the first relay, the operational amplifier coupled in series with the AC to RMS converter, the differentiator, the comparator, and the gain/polarity control;

a programmable gain amplifier coupled with the driver and gain control of the gain/polarity control;

a low pass filter coupled with the programmable gain amplifier; and a second relay coupled with the low pass filter and polarity control of the gain/polarity control.

* * * * *